(12) United States Patent
Imai et al.

(10) Patent No.: US 12,721,064 B2
(45) Date of Patent: Aug. 25, 2026

(54) MANUFACTURING METHOD FOR SEMICONDUCTOR DEVICE

(71) Applicant: Tokyo Electron Limited, Tokyo (JP)

(72) Inventors: Kiyotaka Imai, Tokyo (JP); Motoyuki Sato, Tokyo (JP); Yoshihiro Hirota, Tokyo (JP); Takuya Higuchi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 338 days.

(21) Appl. No.: 18/697,569

(22) PCT Filed: Oct. 4, 2022

(86) PCT No.: PCT/JP2022/037162
§ 371 (c)(1),
(2) Date: Apr. 1, 2024

(87) PCT Pub. No.: WO2023/063176
PCT Pub. Date: Apr. 20, 2023

(65) Prior Publication Data

US 2024/0412970 A1 Dec. 12, 2024

(30) Foreign Application Priority Data

Oct. 12, 2021 (JP) ................................ 2021-167235

(51) Int. Cl.

| | |
|---|---|
| ***H10P 14/60*** | (2026.01) |
| ***H10B 43/20*** | (2023.01) |
| ***H10B 43/35*** | (2023.01) |
| ***H10B 43/40*** | (2023.01) |

(52) U.S. Cl.
CPC .......... *H10P 14/662* (2026.01); *H10B 43/20* (2023.02); *H10B 43/35* (2023.02); *H10B 43/40* (2023.02); *H10P 14/6542* (2026.01)

(58) Field of Classification Search
None
See application file for complete search history.

(56) References Cited

U.S. PATENT DOCUMENTS

2024/0412970 A1* 12/2024 Imai ...................... H10B 43/20

FOREIGN PATENT DOCUMENTS

| | | |
|---|---|---|
| JP | 2018-514498 | 6/2018 |
| JP | 2020-047833 | 3/2020 |
| JP | 2021-044408 | 3/2021 |
| JP | 2021-150601 | 9/2021 |
| WO | 2016/180849 | 11/2016 |

* cited by examiner

*Primary Examiner* — Jack S Chen
(74) *Attorney, Agent, or Firm* — IPUSA, PLLC

(57) ABSTRACT

A manufacturing method for a semiconductor device including a first semiconductor element and a second semiconductor element, includes the steps of forming an insulating layer on a first substrate having a first elastic modulus higher than a second elastic modulus, forming a first semiconductor element having a first bonding surface on the insulating layer, forming a second semiconductor element having a second bonding surface on a second substrate having the second elastic modulus, bonding the first bonding surface and the second bonding surface to each other to form a laminate of the first semiconductor element and the second semiconductor element, and removing the first substrate from the laminate.

16 Claims, 5 Drawing Sheets

(a)
4b
6
7
2
(b)
6
7
2
(c)
8
6
7
2

MANUFACTURING METHOD FOR SEMICONDUCTOR DEVICE

TECHNICAL FIELD

The present disclosure relates to manufacturing methods for semiconductor devices.

BACKGROUND ART

For example, Patent Document 1 proposes a manufacturing method for a semiconductor device, including bonding a first substrate having a first elastic modulus onto a second substrate having a second elastic modulus higher than the first elastic modulus, forming a semiconductor element on the first substrate that is thinned, and thereafter separating the first substrate from the second substrate. In Patent Document 1, Si (silicon single crystal) is used for the first substrate and SiC is used for the second substrate, for example, the Si substrate is bonded onto the SiC substrate, the Si substrate is thereafter thinned, and the semiconductor element is formed on the thinned Si substrate.

PRIOR ART DOCUMENTS

Patent Document

Patent Document 1: Japanese Laid-Open Patent Publication No. 2021-44408

DISCLOSURE OF THE INVENTION

Problem to be Solved by the Invention

The present disclosure provides a technique capable of easily manufacturing a laminate of semiconductor elements while reducing distortion.

Means for Solving the Problem

According to one aspect of the present disclosure, there is provided a manufacturing method for a semiconductor device including a first semiconductor element and a second semiconductor element, including the steps of forming an insulating layer on a first substrate having a first elastic modulus higher than a second elastic modulus; forming a first semiconductor element having a first bonding surface on the insulating layer; forming a second semiconductor element having a second bonding surface on a second substrate having the second elastic modulus; bonding the first bonding surface and the second bonding surface to each other to form a laminate of the first semiconductor element and the second semiconductor element; and removing the first substrate from the laminate.

Effects of the Invention

According to one aspect, a laminate of semiconductor elements can easily be manufactured while reducing distortion.

MODE OF CARRYING OUT THE INVENTION

Figure 1:
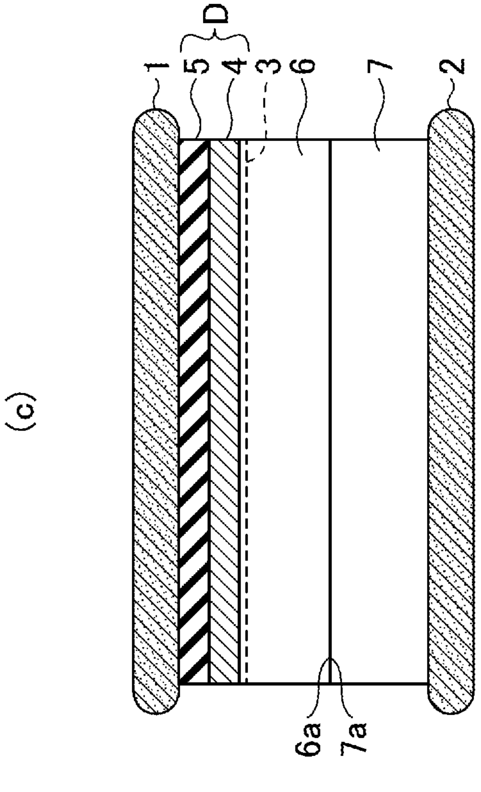
FIG. 1 is a cross sectional view illustrating a manufacturing method for a semiconductor device according to an embodiment.
Figure 1:
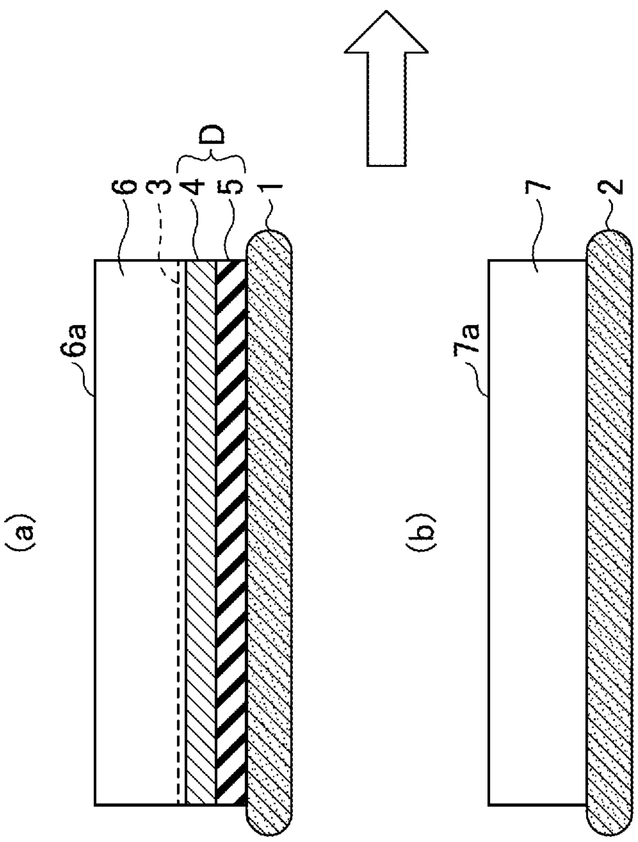

Hereinafter, embodiments for implementing the present disclosure will be described with reference to the drawings. In each of the drawings, the same constituent elements are designated by the same reference numerals, and a repeated description thereof may be omitted.

[Manufacturing Method For Semiconductor Device]

A semiconductor device according to the present embodiment includes a memory cell array having a plurality of memory cells arranged three dimensionally, and a peripheral circuit including a CMOS (Complementary Metal-Oxide-Semiconductor) circuit that controls the memory cell array. The semiconductor device according to the present embodiment is a 3D NAND flash memory, for example.

As an example of a manufacturing method for a semiconductor device having a memory cell array and a peripheral circuit, there is a method of arranging the memory cell array and the peripheral circuit, side by side, on the same Si (silicon) substrate. On the other hand, a known method of manufacturing a 3D NAND Cell on Peri forms the peripheral circuit on the Si substrate, and laminates the memory cells thereon. Further, a known method of manufacturing a 3D NAND Cell Bond Peri forms the peripheral circuit and the memory cell on two Si substrates, respectively, and bonds a metal pad that is connected to a Cu interconnect layer of the peripheral circuit and a metal pad that is connected to a Cu interconnect layer of the memory cell, to each other. According to this method, it is possible to reduce the size of the semiconductor device and increase the circuit integration rate, by laminating the memory cell array and the peripheral circuit.

The memory cell array has a multilayer film in which silicon oxide films and silicon nitride films are alternately laminated. In recent years, the number of laminated layers of the multilayer film has increased to a three-digit number, for example. For this reason, the multilayer film is distorted into a concave shape, a convex shape, a potato chip shape, or the like due to film stress on the multilayer film, and the memory cell array assumes a distorted shape. If the memory cell array has the distorted shape, a focus margin deviates when exposing and patterning a photoresist during a lithography process, and thus, there is a problem in that a patterning accuracy deteriorates.

In contrast, there is a manufacturing method for a semiconductor device, including bonding a Si substrate onto a SiC substrate, thereafter thinning the Si substrate, forming a semiconductor element on the thinned Si substrate, and thereafter separating the Si substrate from the SiC substrate. According to this method, because a peripheral circuit and a semiconductor element of a memory cell array are laminated on the Si substrate, the Si substrate warps, thereby applying film stress to a multilayer film of the memory cell array. Hence, it is difficult to reduce the distortion of the multilayer film. In addition, the step of thinning the Si substrate increases the number of steps of the manufacturing method for the semiconductor device, thereby causing problems in that a productivity deteriorates, and a manufacturing cost increases.

Hence, in the manufacturing method for the semiconductor device according to the present embodiment, a SiC substrate or the like having a higher elastic modulus than a Si substrate is used, and a memory cell array is formed on the SiC substrate or the like. Warping of the substrate can be reduced by using a substrate harder than the Si substrate, and film stress applied to a multilayer film of the memory cell array can be reduced. As a result, distortion of the multilayer film can be reduced, and the problem of the deteriorating patterning accuracy during the lithography process can be eliminated. Further, after the two kinds of substrates are bonded, the step of thinning one of the substrates is not required, thereby enabling the semiconductor device to be manufactured more easily, the productivity to be improved, and the manufacturing cost to be reduced.

Hereinafter, the manufacturing method for the semiconductor device according to the present embodiment will be described in detail, with reference to FIG. 1 through FIG. 4. FIG. 1 through FIG. 4 are cross sectional views illustrating the manufacturing method for the semiconductor device according to the embodiment. The manufacturing method according to the present embodiment manufactures a semiconductor device having a laminate of a first semiconductor element 6 and a second semiconductor element 7 that are laminated. The first semiconductor element 6 includes a memory cell array, and the second semiconductor element 7 includes a peripheral circuit.

First, as illustrated in FIG. 1(*a*), a separation layer D is formed on a surface of a first substrate 1. Next, an insulating layer 3 is formed on a surface of the separation layer D, and the first semiconductor element 6 is formed on the insulating layer 3. The separation layer D may be omitted. In a case where the separation layer D is not provided, the insulating layer 3 is formed on the surface of the first substrate 1, and the first semiconductor element 6 is formed on the insulating layer 3. For the sake of convenience in the following description, the insulating layer 3 may be described as being included in the first semiconductor element 6. The first semiconductor element 6 has a first bonding surface 6*a* on a side opposite from the surface adjacent to a first separation layer 4. In the present embodiment, the separation layer D is provided between the first substrate 1 and the insulating layer 3, and the separation layer D includes the first separation layer 4 and a second separation layer 5. A configuration and functions of the separation layer D will be described later.

As illustrated in FIG. 1(*b*), the second semiconductor element 7 is formed on a surface of a second substrate 2. The second semiconductor element 7 has a second bonding surface 7*a* on a side opposite from the surface adjacent to the second substrate 2. The second substrate 2 has a second elastic modulus, and is monocrystalline silicon, for example. The first substrate 1 has a first elastic modulus higher than the second elastic modulus, and is formed of SiC or sapphire or diamond, for example.

The elastic modulus represented by the first elastic modulus and the second elastic modulus can be represented by at least one index selected from a bending strength, a tensile strength, a Young's modulus, and a thermal expansion coefficient. For example, the first substrate 1 having the first elastic modulus higher than the second elastic modulus is formed of a material having at least one physical property value selected from a higher bending strength, a higher tensile strength, a higher Young's modulus, and a lower thermal expansion coefficient than the second substrate 2 having the second elastic modulus.

Next, as illustrated in FIG. 1(*c*), the first bonding surface 6*a* and the second bonding surface 7*a* are bonded to each other, using the structures illustrated in FIG. 1(*a*) and FIG. 1(*b*), thereby forming a laminate of the first semiconductor element 6 and the second semiconductor element 7 that are laminated. Although FIG. 1(*c*) illustrates the structure including the first substrate 1 and the first semiconductor element 6 turned upside down from the state illustrated in FIG. 1(*a*) when bonding the first bonding surface 6*a* and the second bonding surface 7*a* to each other, the structure including the second substrate 2 and the second semiconductor element 7 may be turned upside down from the state illustrated in FIG. 1(*b*) when bonding the first bonding surface 6*a* and the second bonding surface 7*a* to each other.

Finally, the first substrate 1 is removed from the laminate. The first substrate 1 may be removed from the laminate using any method, as long as method enables the first substrate 1 to be removed from the laminate. For example, the first substrate 1 may be removed by cutting. The first substrate 1 may be polished using a grinding method (Back Side Grinding) or a CMP (Chemical Mechanical Polishing), and the first substrate 1 may be removed thereafter using a wet etching.

By performing the steps described above, the semiconductor device (3D NAND memory) is completed by the manufacturing method according to the present embodiment. The configuration of the embodiment described above is merely an example, and the present embodiment can be applied to other stacked semiconductor devices.

In the semiconductor device manufactured by the manufacturing method according to the present embodiment, the first semiconductor element 6 is formed on the first substrate having a higher elastic modulus than the second substrate formed of single crystal silicon. Hence, warping of the first substrate can be reduced, thereby reducing distortion caused by film stress applied to the multilayer film of the memory cell array included in the first semiconductor element 6. As a result, it is possible to maintain the patterning accuracy during the lithography process.

As described above, in the manufacturing method for the semiconductor device, the following steps (a) through (e) are performed, so that the semiconductor device can easily be manufactured while reducing the distortion of the first semiconductor element 6.

(a) Forming an insulating layer on a first substrate having a first elastic modulus higher than a second elastic modulus.

(b) Forming a first semiconductor element having a first bonding surface on the insulating layer.

(c) Forming a second semiconductor element having a second bonding surface on a second substrate having the second elastic modulus.

(d) Bonding the first bonding surface and the second bonding surface to each other to form a laminate of the first semiconductor element and the second semiconductor element.

(e) Removing the first substrate from the laminate.

[Removing First Substrate Using Separation Layer]

Figure 2:
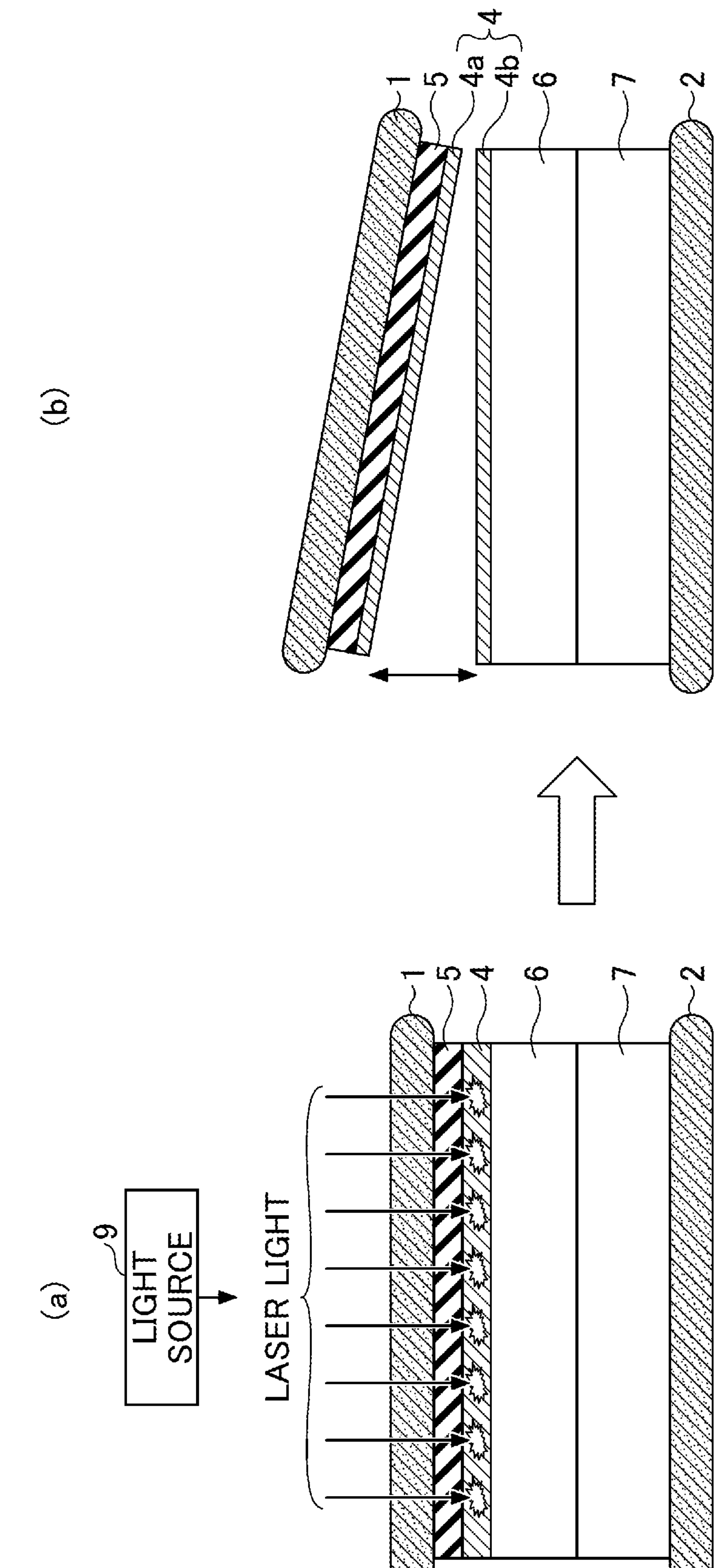
FIG. 2 is a cross sectional view illustrating the manufacturing method for the semiconductor device, continued from FIG. 1.

Next, the step (e) of removing the first substrate 1 using the separation layer D and the subsequent steps will be described with reference to FIG. 2 and FIG. 3. FIG. 2 is a cross sectional view illustrating the manufacturing method for the semiconductor device, continued from FIG. 1. FIG.

3 is a cross sectional view illustrating the manufacturing method for the semiconductor device, continued from FIG. 2.

In the manufacturing method for the semiconductor device according to the present embodiment, the first substrate 1 is removed using the separation layer D. The separation layer D according to the present embodiment includes the first separation layer 4 and the second separation layer 5. The first separation layer 4 and the second separation layer 5 are formed between the first substrate 1 and the first semiconductor element 6.

The first separation layer 4 is formed adjacent to the first semiconductor element 6. As illustrated in FIG. 2(*a*), a light source 9 outputs laser light having a wavelength suitable for conditions described below, and the first separation layer 4 absorbs the laser light, thereby generating heat and thermally expanding. For example, the first separation layer 4 is formed of polysilicon (Poly Si) or polysilicon germanium (Poly SiGe).

The second separation layer 5 is formed between the first separation layer 4 and the first substrate 1. For example, the second separation layer 5 is a silicon oxide film ($SiO_2$) or a silicon nitride film (SiN). Because a strong stress is applied to the first separation layer 4 when removing the first substrate 1, the second separation layer 5 functions as a buffer layer for preventing damage to the first substrate 1 by the stress.

The second separation layer 5 may be omitted, but is preferably provided between the first substrate 1 and the first separation layer 4. By removing the first substrate 1 from the laminate without damage using the second separation layer 5, the first substrate 1 can be reused more easily.

As illustrated in FIG. 2(*a*), the laser light is irradiated from the side of the first substrate 1. For this reason, the first substrate 1 and the second separation layer 5 are formed of a material that transmits the laser light. The first substrate 1 is formed of SiC or sapphire or diamond, for example. In addition, the second separation layer 5 is preferably a silicon oxide film in order to sufficiently transmit the laser light. Thus, the laser light output from the light source 9 can be transmitted through the first substrate 1 and the second separation layer 5 and reach the first separation layer 4.

The laser light is transmitted through the first substrate 1 and the second separation layer 5, and is absorbed by the first separation layer 4. Thus, a force acts to separate the first semiconductor element 6 from the first substrate 1, due to differences in thermal expansion coefficients (differences in stress) between the first separation layer 4 and each of the second separation layer 5 and the first substrate 1, and due to an increase in pressure inside the first separation layer 4 caused by heating. The laser light scans, so that the laser light is irradiated on the entire surface of the first separation layer 4. The first substrate 1 is removed in an order starting from a portion of the first separation layer 4 irradiated with the laser light.

The example in FIG. 2(*b*) illustrates a state where the first separation layer 4 is separated into first separation layers 4*a* and 4*b*, due to the differences in thermal expansion coefficients between the first separation layer 4 and each of the second separation layer 5 and the first substrate 1, and due to the increase in pressure inside the first separation layer 4 caused by the heating. Thus, the first substrate 1 is removed from the first semiconductor element 6. However, the removal is not limited to the removal described above, and the first separation layer 4 may remain attached to the first semiconductor element 6, and the second separation layer 5 may instead be removed together with the first substrate 1. The first separation layer 4 and a portion of the second separation layer 5 may remain attached to the first semiconductor element 6, and a remaining portion of the second separation layer 5 may be removed together with the first substrate 1.

The laser light output from the light source 9 is only required to have a wavelength such that the laser light can be transmitted through the first substrate 1. For example, in the case where the first substrate 1 is formed of sapphire or diamond, for example, light having a wavelength greater than or equal to 200 nm and less than or equal to 1500 nm can be transmitted through the first substrate 1. Accordingly, in the case where the first substrate 1 is formed of sapphire or diamond, the wavelength of the laser light output from the light source 9 may be greater than or equal to 200 nm and less than or equal to 1500 nm. However, in the case where the first substrate 1 is formed of sapphire or diamond, the wavelength of the laser light to be irradiated is more preferably greater than or equal to 300 nm and less than or equal to 400 nm.

The first separation layer 4 and the second separation layer 5 are formed of materials that can exhibit the respective functions according to the material used for the first substrate 1. In the case where the first substrate 1 is formed of sapphire or diamond and the wavelength of the laser light output from the light source 9 is less than or equal to 400 nm, the first separation layer 4 is preferably formed of polysilicon. In this case, the first separation layer 4 can sufficiently absorb the laser light having the wavelengths less than or equal to 400 nm. The second separation layer 5 is preferably a silicon oxide film, as described above.

In the case where the first substrate 1 is formed of SiC, light having a wavelength greater than or equal to 400 nm and less than or equal to 1500 nm can be transmitted through the first substrate 1. Accordingly, in the case where the first substrate 1 is formed of SiC, the wavelength of the laser light output from the light source 9 can be greater than or equal to 400 nm and less than or equal to 1500 nm. However, in the case where the first substrate 1 is formed of SiC, the wavelength of the laser light to be irradiated is more preferably greater than or equal to 450 nm and less than or equal to 600 nm. In addition, in the case where the first substrate 1 is formed of SiC, the first separation layer 4 is preferably formed of polysilicon germanium. In this case, the first separation layer 4 can sufficiently absorb the laser light having the wavelength less than or equal to 1500 nm. The second separation layer 5 is preferably a silicon oxide film, as described above. In the case where the first substrate 1 is formed of sapphire or diamond or Sic, it is important that the laser light is completely absorbed by the first separation layer 4 and does not damage a device structure, such as the memory cell array or the like inside the first semiconductor element 6. For this reason, the first separation layer 4 preferably has a thickness greater than or equal to 50 nm so as to completely absorb the laser light.

As illustrated in the example in FIG. 2(*b*), the first separation layer 4 remains on at least one of the first substrate 1 and the first semiconductor element 6. In the example illustrated in FIG. 2(*b*), the first separation layer 4 remains on both the first substrate 1 and the first semiconductor element 6, by being divided into the first separation layer 4*a* on the first substrate 1 and the first separation layer 4*b* on the first semiconductor element 6. The second separation layer 5 may remain only on the first substrate 1, or may remain on both the first substrate 1 and the first semiconductor element 6.

Figure 3:
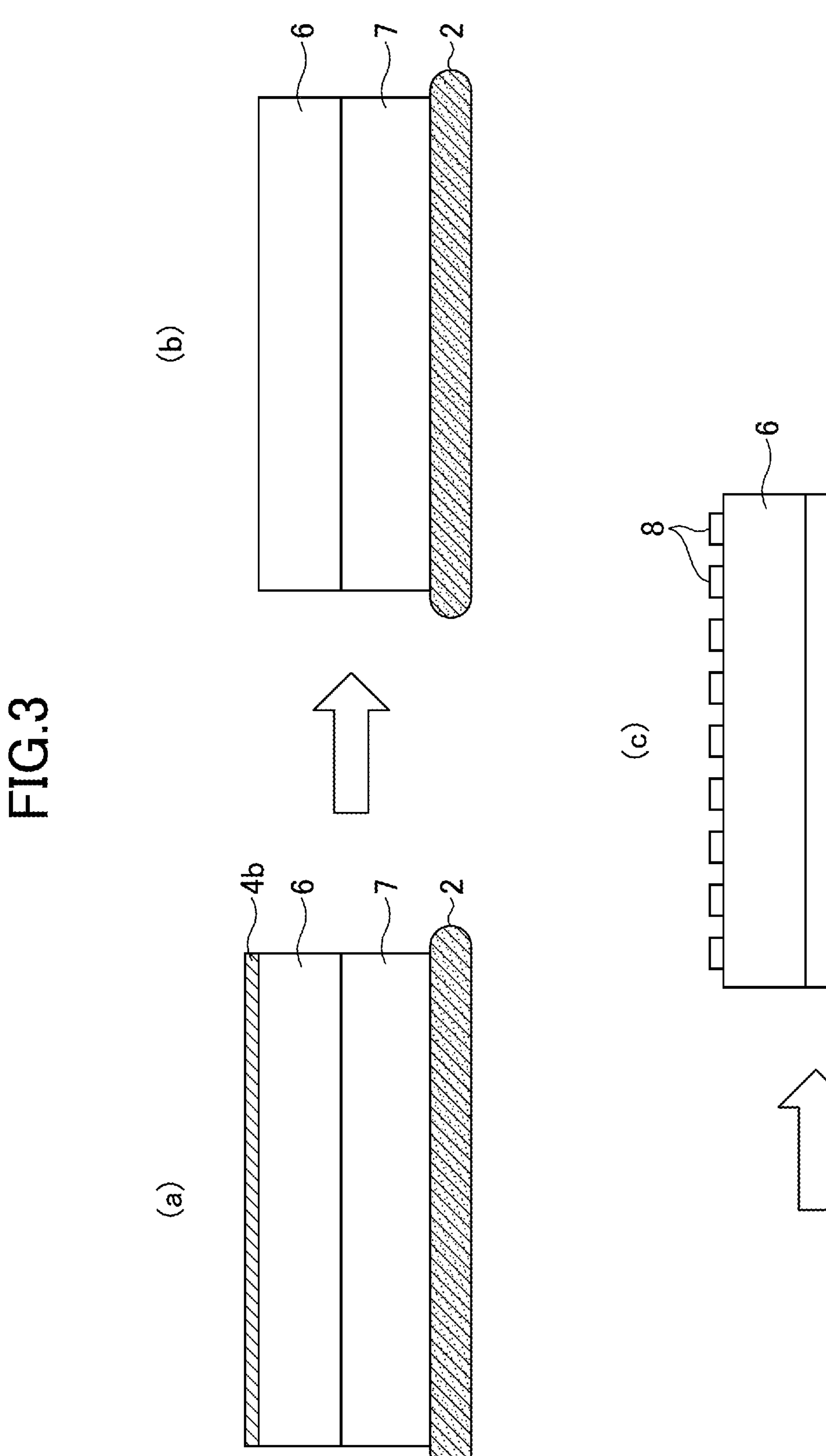
FIG. 3 is a cross sectional view illustrating the manufacturing method for the semiconductor device, continued from FIG. 2.

FIG. 3 is a cross sectional view illustrating the manufacturing method for the semiconductor device, continued from FIG. 2. The first separation layer 4*b* remaining on the first semiconductor element 6 illustrated in FIG. 3(*a*) may be removed by a wet etching or a CMP. In the case where the second separation layer 5 remains on the first semiconductor element 6, the second separation layer 5 may be removed by a wet etching using a hydrofluoric acid. The first separation layer 4*b* on the first semiconductor element 6 may remain without being removed, and the removal of the first separation layer 4*b* can be omitted. Similarly, the second separation layer 5 on the first semiconductor element 6 may remain without being removed, and the removal of the second separation layer 5 can be omitted.

After the first substrate 1 is removed, the first separation layer 4*b* is removed from the laminate of the first semiconductor element 6 and the second semiconductor element 7 on the second substrate 2, as illustrated in FIG. 3(*b*). In this state, as illustrated in FIG. 3(*c*), the probing pad 8 is formed on the surface of the first semiconductor element 6. Thus, the manufacturing of the semiconductor device including the laminate of the first semiconductor element 6 having the probing pad 8 and the second semiconductor element 7 8 is completed. The probing pad 8 enables an electrical connection with an external element.

[Reusing First Substrate]

Figure 4:
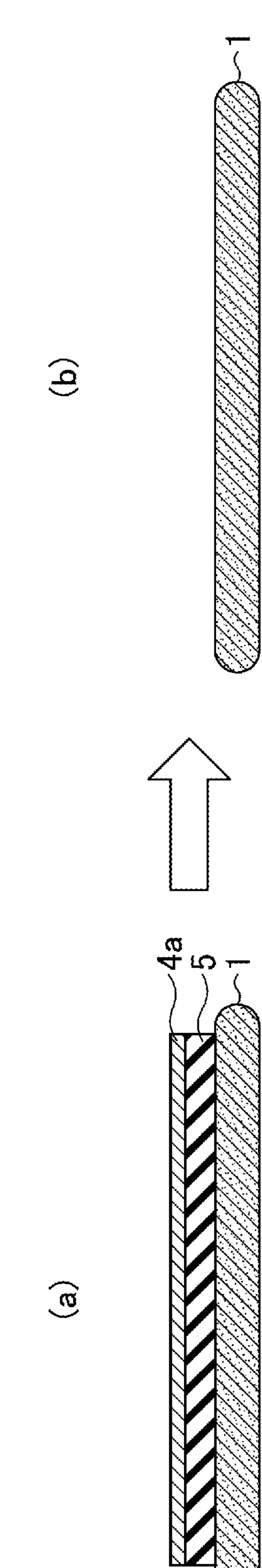
FIG. 4 is a cross sectional view illustrating a method for reusing a first substrate separated in FIG. 2 (the manufacturing method for the semiconductor device).

Next, reusing of the first substrate 1 will be described with reference to FIG. 4. FIG. 4 is a cross sectional view illustrating a method for reusing the first substrate 1 separated from the first semiconductor element 6, as illustrated in FIG. 2(*b*). The method for reusing the first substrate 1 illustrated in FIG. 4 is one step of the manufacturing method for the semiconductor device according to the present embodiment.

The first substrate 1 separated from the first semiconductor element 6 in FIG. 2(*b*) is cleaned. The second separation layer 5 can be removed without damaging the first substrate 1, by removing the second separation layer 5 by a wet etching using a hydrofluoric acid.

As illustrated in FIG. 4(*a*), in the case where the first separation layer 4*a* remains in addition to the second separation layer 5, the first separation layer 4*a* is removed by a wet etching or a CMP. Accordingly, it becomes possible to reuse the first substrate 1. In a case where the first substrate 1 is damaged when removing the second separation layer 5 or the first separation layer 4*a*, it becomes possible to reuse the first substrate 1, by polishing and planarizing the damaged surface of the first substrate 1 by CMP.

After the first substrate 1 is cleaned, a new insulating layer 3 is formed on the first substrate 1. Further, the steps (b) through (e) are performed, thereby manufacturing a new semiconductor device. In this case, the first substrate can be reused for manufacturing the semiconductor device.

[Examples of Memory Cell Array and Peripheral Circuit]

Figure 5:
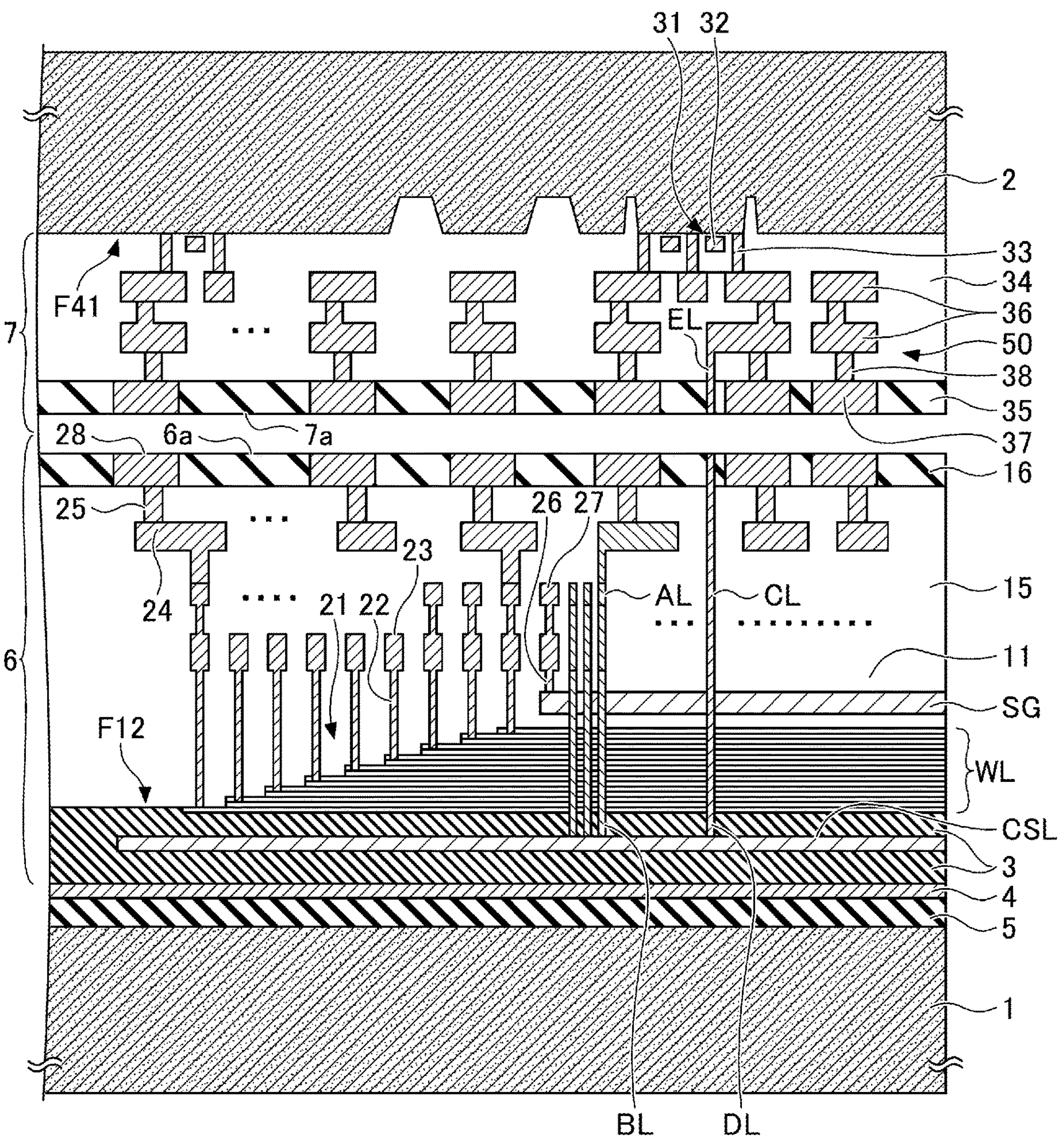
FIG. 5 is a cross sectional view illustrating examples of a memory cell array and a peripheral circuit of the semiconductor device according to an embodiment.

An example of the internal configuration of the laminate of the first semiconductor element 6 and the second semiconductor element 7 manufactured by the manufacturing method for the semiconductor device according to the present embodiment will be described with reference to FIG. 5. FIG. 5 illustrates the laminate illustrated in FIG. 1(*c*) in an upside down state, with the first semiconductor element 6 on the lower side and the second semiconductor element 7 on the upper side.

FIG. 5 is an enlarged cross sectional view of the structure of a periphery of a columnar part BL of the memory cell array 11 of the first semiconductor element 6, and a part of and a periphery of a CMOS circuit of a peripheral circuit 50 of the second semiconductor element 7. The memory cell array 11 in FIG. 5 mainly illustrates a staircase structure 21.

As illustrated in FIG. 5, the second separation layer 5, the first separation layer 4, and the insulating layer 3 are laminated in this order on the first substrate 1, and the memory cell array 11 including a plurality of memory cells is formed on the insulating layer 3. A conductive common source line CSL is formed in the insulating layer 3, and the columnar part BL of the memory cell array 11 is connected to the common source line CSL.

The memory cell array 11 includes a plurality of conductor layers (word lines WL) and a plurality of insulating layers laminated in a Z direction (direction perpendicular to the first bonding surface 6*a*). The plurality of conductor layers are provided as a plurality of word lines WL. The plurality of insulating layers are provided between the plurality of word lines WL that are adjacent in the Z direction, and electrically insulate the plurality of word lines WL from one another. Each word line WL is electrically connected to a word interconnect layer 23 via a contact plug 22. The word line WL is formed of a conductive material, such as tungsten or the like, for example. The plurality of insulating layers include insulating films, such as silicon oxide films or the like, for example.

A selection gate SG is provided on a laminate of the word lines WL and the insulating layers. The selection gate SG is electrically connected to a selection gate interconnect layer 27 via a contact plug 26. The selection gate SG is also formed of a conductive material, such as tungsten or the like, for example. An interlayer insulating film 15 is provided on the selection gate SG. Further, an interconnect layer 24, a contact plug 25, and a metal pad 28 are formed inside or on the interlayer insulating film 15. An interlayer insulating film 16 is provided between the metal pads 28 of an uppermost layer.

The columnar part BL penetrates the word lines WL and the selection gate SG, and is electrically connected to the bit line AL. The columnar part BL includes a memory insulating film, a channel semiconductor layer, and a core insulating film extending in the Z direction. The memory insulating film includes a block insulating film, a charge storage layer, and a tunnel insulating film.

By setting the selection gate SG to a conductive state, the columnar part BL is selectively connected to the bit line AL and receives a voltage from the bit line AL. In the selected columnar part BL, charges are injected/discharged between the channel semiconductor layer and the charge storage layer via the tunnel insulating film. Thus, data can be written or erased. The block insulating film is provided to block the charge of the charge storage layer from leaking to the word line WL. The configuration at an intersection of the word line WL and the memory insulating film corresponds to the memory cell. The memory cell array 11 having such configurations and functions is formed on the first substrate 1.

The first substrate 1 formed of SiC or the like is used as a support substrate, and the memory cell array 11 is formed on the first substrate 1. That is, the memory cell array 11 is supported on the first substrate 1 having a higher elastic modulus than the second substrate 2. Thus, the first substrate 1 is harder than the second substrate 2 formed of Si or the like, and the first substrate 1 does not warp, so that the memory cell array 11 can be supported on the surface of the first substrate 1 can maintain an approximately flat state by being supported on the surface of the first substrate 1.

In this state, the first semiconductor element 6 is oriented to face a first surface F41 of the second substrate 2 and the second semiconductor element 7 is oriented to face a second surface F12 of the first substrate 1, so that as to connect the memory cell array 11 to the peripheral circuit 50. Although FIG. 5 illustrates a state where the first bonding surface 6*a* of the first semiconductor element 6 and the second bonding surface 7*a* of the second semiconductor element 7 are non in contact with each other, the first bonding surface 6*a* of the first semiconductor element 6 and the second bonding surface 7*a* of the second semiconductor element 7 are bonded to each other by the bonding performed from this state. Accordingly, the metal pads 28 on the side of the first semiconductor element 6 and metal pads 37 on the side of the second semiconductor element 7 make contact with one another. The metal pads 28 and 37 are formed of a conductive material, such as copper, tungsten, or the like, for example. An interlayer insulating film 35 is provided between the metal pads 37.

The peripheral circuit 50 includes a CMOS circuit (logic circuit) configuring a controller of the memory cell array 11, for example. The second semiconductor element 7 of FIG. 5 is a cross sectional view illustrating the structure of a part of and a periphery of the peripheral circuit 50 including the CMOS circuit. A plurality of transistors 31 are provided on the first surface F41 of the second substrate 2. Each transistor 31 includes a gate electrode 32 provided on the first surface F41 of the second substrate 2 via a gate insulating film, and a source diffusion layer and a drain diffusion layer that are not illustrated but provided inside the second substrate 2. The plurality of transistors 31 form the CMOS circuit, and function so as to control the memory cell array 11.

Moreover, an interlayer insulating film 34 is provided on the CMOS circuit, a plurality of plugs 33 are provided on the source diffusion layer or the drain diffusion layer of the transistor 31, and a multilayer interconnect structure 36 is provided on the plugs 33. Further, contact plugs 38 are provided on the multilayer interconnect structure 36, and the metal pads 37 are connected to the contact plugs 38. The peripheral circuit 50 having such a configuration is formed on the first surface F41 of the second substrate 2.

The first semiconductor element 6 having the memory cell array 11 and the second semiconductor element 7 having the peripheral circuit 50 are bonded to each other, by bonding the first bonding surface 6*a* and the second bonding surface 7*a* to each other in the manner described above. As illustrated in FIG. 1(*c*) and FIG. 5, the memory cell array 11 and the peripheral circuit 50 are laminated in the Z direction between the first substrate 1 and the second substrate 2.

Accordingly, the metal pads 28 exposed from the first bonding surface 6*a* and the metal pads 37 exposed from the second bonding surface 7*a* make contact with one another and are electrically connected to one another. Hence, it is possible to control the memory cell array 11 therewith. The metal pads 28 and the metal pads 37 are arranged so as to correspond to one another when the peripheral circuit 50 and the memory cell array 11 face each other.

In addition, a contact line DL connected to the common source line CSL penetrates the word lines WL and the selection gate SG, and is connected to a contact line CL. The contact line CL is connected to a contact line EL that is connected to the CMOS circuit, by bonding the first bonding surface 6*a* and the second bonding surface 7*a* to each other. Thus, the multilayer interconnect structure 36 of the second semiconductor element 7 is electrically connected to the common source line CSL.

As described above, according to the manufacturing method for the semiconductor device according to the present embodiment, the first semiconductor element 6 having the memory cell array 11 is formed on the first substrate 1, such as the SiC substrate or the like having the first elastic modulus. In addition, the second semiconductor element 7 having the peripheral circuit 50 is formed on the second substrate 2, such as the Si substrate or the like having the second elastic modulus.

Then, the first semiconductor element 6 and the second semiconductor element 7 are bonded to each other by the bonding, and the memory cell array 11 and the peripheral circuit 50 are electrically connected to each other in a state where the first semiconductor element 6 and the second semiconductor element 7 are laminated.

The first substrate 1 having the first elastic modulus is formed of a material having a higher elastic modulus than the second substrate 2 having the second elastic modulus. For example, the first substrate 1 is formed of SiC, and the second substrate 2 is formed of Si. For this reason, the multilayer film included in the memory cell array 11 on the first substrate 1 is less likely to be distorted compared to the case where the memory cell array 11 is formed on the second substrate 2. Thus, the memory cell array 11 is supported by the surface of the first substrate 1, and can maintain an approximately flat state. As a result, the laminate of the semiconductor elements can easily be manufactured while reducing the distortion of the memory cell array 11.

In addition, it is difficult to form the peripheral circuit 50 on the SiC substrate because the yield is deteriorated thereby. Hence, in the manufacturing method for the semiconductor device according to the embodiment, the first semiconductor element 6 having the memory cell array 11 formed on the first substrate 1, and the first semiconductor element 6 and the second semiconductor element 7 are laminated using the bonding technique. Hence, in the manufacturing method for the semiconductor device according to the present embodiment, the memory cell array 11 can be formed on the first substrate 1 formed of a material having a higher elastic modulus than the second substrate 2, and the peripheral circuit 50 can be formed on the second substrate 2. As a result, it is possible to avoid the deterioration of the yield which would otherwise occur if the peripheral circuit 50 were formed on the first substrate 1 having a higher elastic modulus than the second substrate 2.

Moreover, after the first semiconductor element 6 and the second semiconductor element 7 are laminated, the first substrate 1 is removed from the first semiconductor element 6. The removed first substrate 1 can be cleaned, and a new insulating layer can thereafter be formed on the first substrate 1, and for use in manufacturing a new semiconductor device. Thus, the first substrate 1 can be reused, and the manufacturing cost can be reduced.

The manufacturing method for the semiconductor device according to the embodiment disclosed herein is merely an example in all respects and should not be construed as being limiting. The embodiments may be modified and improved in various forms without departing from the scope and spirit of the appended claims. The matters described in a plurality of embodiments can be combined within a range not contradictory with one another.

This application is based upon and claims priority to Japanese Patent Application No. 2021-167235, filed on Oct. 12, 2021, the entire contents of which are incorporated herein by reference.

DESCRIPTION OF THE REFERENCE NUMERALS

1: First substrate
2: Second substrate

3: Insulating layer
4: First separation layer
5: Second separation layer
6: First semiconductor element
6*a*: First bonding surface
7: Second semiconductor element
7*a*: Second bonding surface
11: Memory cell array
50: Peripheral circuit
D: Separation layer

The invention claimed is:

1. A manufacturing method for a semiconductor device including a first semiconductor element and a second semiconductor element, comprising the steps of:

(a) forming an insulating layer on a first substrate having a first elastic modulus higher than a second elastic modulus;
(b) forming a first semiconductor element having a first bonding surface on the insulating layer;
(c) forming a second semiconductor element having a second bonding surface on a second substrate having the second elastic modulus;
(d) bonding the first bonding surface and the second bonding surface to each other to form a laminate of the first semiconductor element and the second semiconductor element; and
(e) removing the first substrate from the laminate.

2. The manufacturing method for the semiconductor device as claimed in claim 1, wherein the first semiconductor element includes a memory cell array, and
the second semiconductor element includes a peripheral circuit.

3. The manufacturing method for the semiconductor device as claimed in claim 1, wherein the first substrate is formed of SiC or sapphire or diamond.

4. The manufacturing method for the semiconductor device as claimed in claim 3, wherein a separation layer is provided between the first substrate and the insulating layer.

5. The manufacturing method for the semiconductor device as claimed in claim 4, wherein the separation layer includes a first separation layer, and
the step (e) includes irradiating laser light on the first separation layer to cause the first separation layer to absorb the laser light and thermally expand, thereby removing the first substrate.

6. The manufacturing method for the semiconductor device as claimed in claim 5, wherein the first separation layer is formed of polysilicon (Poly Si) or polysilicon germanium (Poly SiGe).

7. The manufacturing method for the semiconductor device as claimed in claim 5, wherein the separation layer includes a second separation layer between the first separation layer and the first substrate.

8. The manufacturing method for the semiconductor device as claimed in claim 7, wherein the second separation layer is a silicon oxide film ($SiO_2$) or a silicon nitride film (SIN).

9. The manufacturing method for the semiconductor device as claimed in claim 5, wherein a wavelength of the laser light that is irradiated is greater than or equal to 200 nm and less than or equal to 1500 nm in a case where the first substrate is formed of sapphire or diamond.

10. The manufacturing method for the semiconductor device as claimed in claim 9, wherein the wavelength of the laser light that is irradiated is greater than or equal to 300 nm and less than or equal to 400 nm.

11. The manufacturing method for the semiconductor device as claimed in claim 5, wherein a wavelength of the laser light that is irradiated is greater than or equal to 400 nm and less than or equal to 1500 nm in a case where the first substrate is formed of SiC.

12. The manufacturing method for the semiconductor device as claimed in claim 11, wherein the wavelength of the laser light that is irradiated is greater than or equal to 450 nm and less than or equal to 600 nm.

13. The manufacturing method for the semiconductor device as claimed in claim 12, wherein the wavelength of the laser light that is irradiated is greater than or equal to 450 nm.

14. The manufacturing method for the semiconductor device as claimed in claim 1, wherein the second substrate is formed of single crystal silicon.

15. The manufacturing method for the semiconductor device as claimed in claim 1, further comprising the steps of:

(f) cleaning the first substrate removed from the laminate;
wherein the step (a) forms a new insulating layer on the cleaned first substrate after the step (f).

16. The manufacturing method for the semiconductor device as claimed in claim 15, further comprising the steps of:

(e) after forming the new insulating layer on the first substrate, manufacturing a new semiconductor device by performing the steps (b) through (e), thereby reusing the first substrate.

* * * * *